United States Patent
Priel et al.

(10) Patent No.: US 9,766,651 B2
(45) Date of Patent: Sep. 19, 2017

(54) CLOCK SOURCE, METHOD FOR DISTRIBUTING A CLOCK SIGNAL AND INTEGRATED CIRCUIT

(71) Applicants: Michael Priel, Netanya (IL); Dan Kuzmin, Givat Shmuel (IL); Sergey Sofer, Rishon Lezion (IL)

(72) Inventors: Michael Priel, Netanya (IL); Dan Kuzmin, Givat Shmuel (IL); Sergey Sofer, Rishon Lezion (IL)

(73) Assignee: NXP USA, Inc., Austin, TX (US)

( * ) Notice: Subject to any disclaimer, the term of this patent is extended or adjusted under 35 U.S.C. 154(b) by 132 days.

(21) Appl. No.: 14/651,279

(22) PCT Filed: Jan. 8, 2013

(86) PCT No.: PCT/IB2013/050152
§ 371 (c)(1),
(2) Date: Jun. 11, 2015

(87) PCT Pub. No.: WO2014/108736
PCT Pub. Date: Jul. 17, 2014

(65) Prior Publication Data
US 2015/0316952 A1    Nov. 5, 2015

(51) Int. Cl.
*G05F 1/10* (2006.01)
*G06F 1/10* (2006.01)
(Continued)

(52) U.S. Cl.
CPC ............... *G06F 1/10* (2013.01); *G06F 1/12* (2013.01); *H03K 3/012* (2013.01); *H03L 7/08* (2013.01);
(Continued)

(58) Field of Classification Search
CPC .. G06F 1/10; G06F 1/12; H03K 3/012; H03L 7/099; H03L 7/06; H03L 7/07;
(Continued)

(56) References Cited

U.S. PATENT DOCUMENTS

| | | | |
|---|---|---|---|
| 6,194,969 B1 * | 2/2001 | Doblar | G06F 1/04 327/292 |
| 6,570,456 B2 * | 5/2003 | Mano | H03L 7/07 327/158 |

(Continued)

FOREIGN PATENT DOCUMENTS

WO    2005117263    12/2005

OTHER PUBLICATIONS

International Search Report and Written Opinion correlating to pct/ib2013/050152 issued on Oct. 8, 2013.

*Primary Examiner* — Jung Kim

(57) ABSTRACT

The present invention provides a clock source for an integrated circuit, comprising a primary oscillator adapted to generate a primary clock signal based on a reference control signal, at least one secondary oscillator each secondary oscillator being adapted to generate a secondary clock signal based on the reference control signal, wherein for each secondary oscillator a frequency correction unit is provided and adapted to adjust the reference control signal for the associated secondary oscillator based on the primary clock signal and the secondary clock signal of the associated secondary oscillator such that the clock frequency of the secondary clock signal of the associated secondary oscillator essentially equals the clock frequency of the primary clock signal. The present invention furthermore provides a method for providing a clock signal, and an integrated circuit.

17 Claims, 6 Drawing Sheets

(51) Int. Cl.
*H03K 3/012* (2006.01)
*H03L 7/099* (2006.01)
*H03L 7/097* (2006.01)
*H03L 7/08* (2006.01)
*G06F 1/12* (2006.01)

(52) U.S. Cl.
CPC .............. *H03L 7/097* (2013.01); *H03L 7/099* (2013.01); *H03L 7/0992* (2013.01)

(58) Field of Classification Search
CPC ......... H03L 7/08; H03L 7/0805; H03L 7/083; H03L 7/087; H03L 7/089; H03L 7/097; H03L 7/0992
See application file for complete search history.

(56) References Cited

U.S. PATENT DOCUMENTS

| | | | |
|---|---|---|---|
| 6,590,949 B1 * | 7/2003 | Marten | H03D 13/004 327/147 |
| 7,173,495 B1 | 2/2007 | Kenny et al. | |
| 7,296,170 B1 | 11/2007 | Richmond et al. | |
| 7,619,484 B2 | 11/2009 | McCoy | |
| 8,013,681 B2 * | 9/2011 | Beghini | H03C 3/0941 331/2 |
| 8,415,999 B2 * | 4/2013 | Ding | H03L 7/22 327/148 |
| 2007/0121773 A1 * | 5/2007 | Kuan | H03L 7/081 375/376 |
| 2011/0316593 A1 | 12/2011 | Muench et al. | |
| 2012/0014490 A1 | 1/2012 | Pollock et al. | |

\* cited by examiner

CLOCK SOURCE, METHOD FOR DISTRIBUTING A CLOCK SIGNAL AND INTEGRATED CIRCUIT

FIELD OF THE INVENTION

This invention relates to a distributed clock signal generator for an integrated circuit, a method for distributing a clock signal to integrated circuits and to an integrated circuit comprising such a distributed clock signal generator.

BACKGROUND OF THE INVENTION

Digital circuits or integrated circuits are commonly used in a variety of different applications. Especially in signal processing applications and other calculation intensive applications there is an ever increasing demand for more computing power and at the same time for reduced power consumption.

In order to provide more computing power in a single integrated circuit the clock frequency or the clock frequencies of the integrated circuit can be increased. An increased clock frequency will result in shorter instruction cycles in e.g. a processor core and will, therefore, allow more computations per time interval.

If the clock frequency of the integrated circuit is increased, special means have to be provided to effectively shield the clock signal paths, for example a slow clock track SCT and a fast clock track FCT. FIG. 6 shows a block diagram of a clock signal path in a common integrated circuit, where a low frequency reference clock SRC is provided to a I/O-Terminal IO of an integrated circuit and forwarded through a buffer BUF and a multiplexer MUX to a phase locked loop, PLL. This PLL generates a high frequency or fast clock signal FCS which is provided to a target logic T through a divider DIV, a multiplexer MUS and a buffer BUF.

FIG. 6 illustrates that there are different points in the signal chain where interferences such as noise N influence the clock signals. Before the low frequency reference clock is provided to the PLL a I/O supply noise and a chip supply noise as well as cross coupling between the different signal lines of the integrated circuit may have an impact on the low frequency reference clock signal. The high frequency clock signal provided by the PLL is then deteriorated by different cross couplings and the chip supply noise N.

If such a high frequency clock signal is to be used in an integrated circuit, it will be typically supplied to different logic units of the integrated circuit. However, in order to supply said high frequency clock signal to the different logic units of the integrated circuit extensive shielding and correction measures have to be provided in the integrated circuit in order to guarantee a failure free transmission of the high frequency clock signal to the different integrated logic units. However, this shielding goes always along with additional circuitry effort.

One option to avoid such a shielding and correction circuitry would be to add a redundant, duplicate circuit of the integrated circuit's PLL which is placed in close proximity to each single logic unit. However, for placing local PLLs near the single logic units the low frequency clock still has to be routed to the single PLLs and shielding and correction measures are still not entirely dispensable. Furthermore, providing local PLLs will increase the overall power consumption of the integrated circuit and require a significant chip area. Hence, this would lead to a more complex and thus expensive integrated circuit which should be avoided in modern design of integrated circuits.

SUMMARY OF THE INVENTION

The present invention provides a distributed clock signal generator for an integrated circuit, an integrated circuit and a method for distributing a clock signal for integrated circuits as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

In all figures of the drawings elements, features and signals which are the same or at least have the same functionality have been provided with the same reference symbols, unless explicitly stated otherwise.

DETAILED DESCRIPTION OF THE PREFERRED EMBODIMENTS

Figure 1:
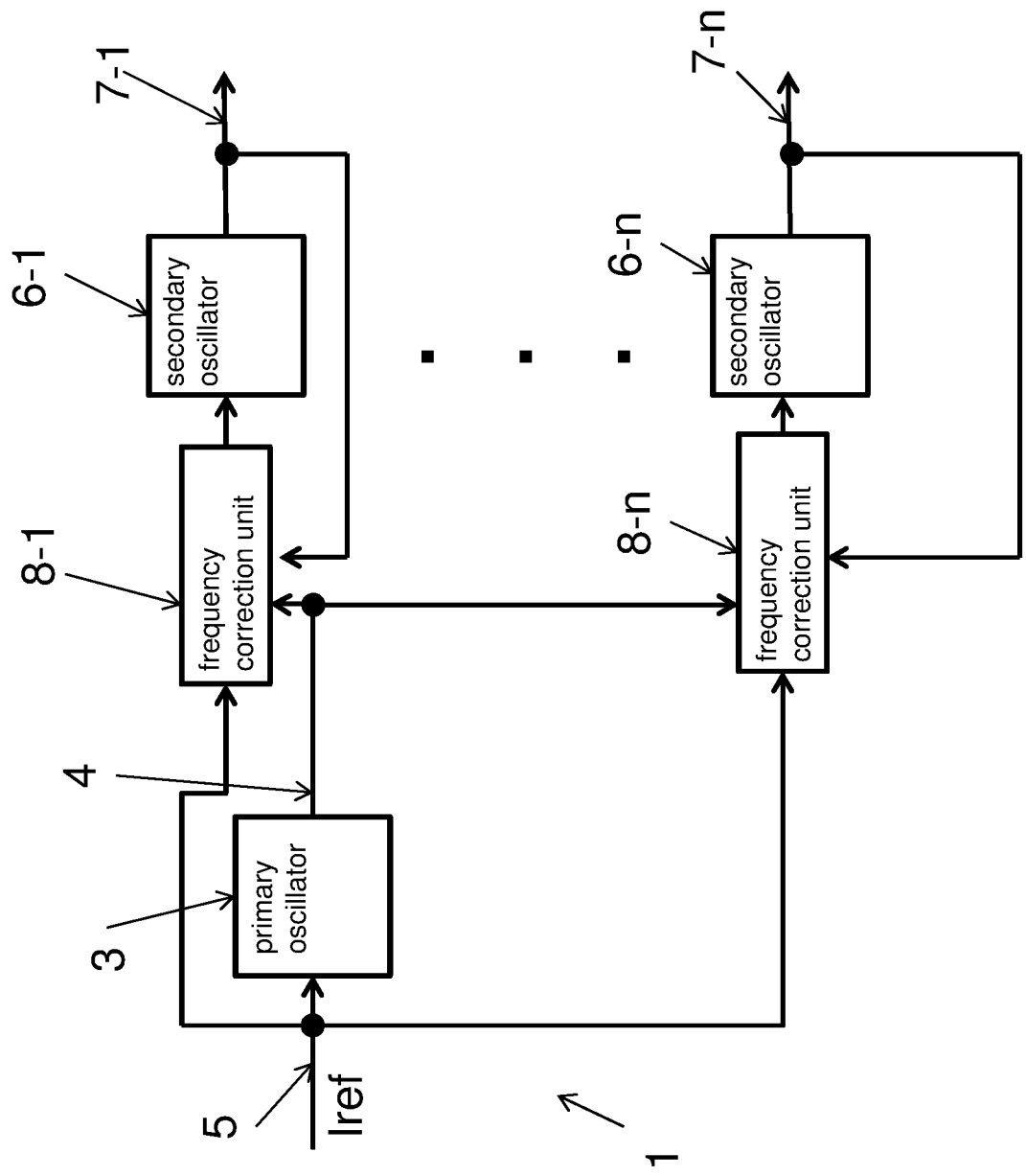
FIG. 1 schematically shows an example of an embodiment of a distributed clock signal generator according to the present invention.

Skilled artisans will appreciate that elements in the figures are illustrated for simplicity and clarity and have not necessarily drawn to scale. For example, the chosen elements are only used to help to improve the understanding of the functionality and the arrangements of these elements in various embodiments of the present invention. Also, common but well understood elements that are useful or necessary in a commercial feasible embodiment are mostly not depicted in order to facilitate a less abstracted view of these various embodiments of the present invention. It will further be appreciated that certain actions and/or steps in the described method may be described or depicted in a particular order of occurrences while those skilled in the art will understand that such specificity with respect to sequence is not actually required. It will also be understood that the terms and expressions used in the present specification have the ordinary meaning as it accorded to such terms and expressions with respect to their corresponding respective areas of inquiry and study except where specific meanings have otherwise be set forth herein.

As described in more detail with reference to the details shown in the drawings, in an example a distributed clock signal generator in or for an integrated circuit is proved. The distributed clock signal generator may comprise a primary oscillator configured to generate a primary clock signal based on a reference control signal, and at least one secondary oscillator wherein each secondary oscillator being configured to generate a secondary clock signal based on the reference control signal, wherein for each secondary oscillator a frequency correction unit is provided and configured such to adjust the reference control signal for the associated secondary oscillator based on the primary clock signal and the secondary clock signal of the associated secondary oscillator such that the clock frequency of the secondary clock signal of the associated secondary oscillator essentially equals the clock frequency of the primary clock signal.

In another example an integrated circuit is provided, comprising at least one distributed clock signal generator according to the present invention for providing a primary clock signal and at least one secondary clock signal, at least one primary logic unit which is supplied with the primary clock signal, and at least one secondary logic unit which is supplied with one of the secondary clock signals.

Furthermore, a method for distributing a clock signal for integrated circuits is provided, comprising: providing a primary oscillator and at least one secondary oscillator, generating by the primary oscillator a primary clock signal based on a reference control signal, generating by the at least one secondary oscillator a secondary clock signal based on the reference control signal, and increasing or decreasing the reference control signal of the at least one secondary oscillator based on a difference of the primary clock signal and the secondary clock signal of the respective secondary oscillator such that the clock frequency of the respective secondary clock signal essentially equals the clock frequency of the primary clock signal.

The examples described herein use the insight that duplicating clock signals in an integrated circuit by duplicating PLLs in the integrated circuit increases the complexity of the clock generation excessively. It is therefore a finding of the present invention to enable remotely duplicating a primary clock signal without requiring duplicating a complete PLL wherever a clock signal is needed.

Accordingly, a primary oscillator generates a primary clock signal and at least one secondary oscillator generates a secondary clock signal. Both, the primary oscillator and the secondary oscillator receive a reference control signal to generate the clock signals.

For every secondary oscillator a frequency correction unit is provided, which is adapted to adjust the reference control signal for the associated secondary oscillator based on the primary clock signal and the respective secondary clock signal.

The frequency correction units adjust the reference control signal such that the clock frequencies of the secondary clock signals essentially equal the clock frequency of the primary clock signal. In this context the term essentially refers to the frequencies deviating from each other no more than a predetermined, i.e. acceptable deviation level.

By providing frequency correction units the present patent application allows duplicating the primary clock signal in a variety of secondary oscillators without that complex circuitry needed to provide a separate PLL in place of the frequency correction units and the secondary oscillators.

In an embodiment each frequency correction unit comprises an integrator which is adapted to integrate the primary clock signal and to integrate the secondary clock signal of the associated secondary oscillator and wherein each frequency correction unit is adapted to adjust the reference control signal for the associated secondary oscillator based on the difference between the integrated primary clock signal and the integrated respective secondary clock signal. Providing an adapted reference control signal based on integrations allows providing a distributed clock signal generator of low complexity.

In an embodiment the integrator comprises a first counter adapted to count the clock cycles of the primary clock signal and a second counter adapted to count the clock cycles of the secondary clock signal of the associated secondary oscillator. Using counters to integrate the primary clock signal and the secondary clock signal of the associated secondary oscillator further reduces the complexity of the distributed clock signal generator according to the present invention.

In an embodiment each frequency correction unit is adapted to integrate the primary clock signal and the secondary clock signal of the associated secondary oscillator over a predefined time interval and to provide the adjusted reference control signal after every time interval. Adjusting the reference control signal in predetermined time intervals allows providing a constant adjustment of the reference control signal.

In an embodiment the time interval is longer than a period duration of the frequency of the primary clock signal, in particular 1 to 20 times the period duration of the frequency of the primary clock signal, or in particular 5 to 15 times the period duration of the frequency of the primary clock signal, or in particular 10 times the period duration of the frequency of the primary clock signal. This allows adapting the present invention to different use cases.

In an embodiment each frequency correction unit comprises a comparator adapted to calculate the difference between the integrated primary clock signal and the integrated secondary clock signal of the associated secondary oscillator.

In an embodiment the reference control signal is a control current, wherein this control current can in particular be a direct current. The term direct current doesn't limit the current to being a current of a constant current value. The term direct current refers to a slow changing positive or negative current which has no alternating periods of positive and negative current values at a given frequency. Using a current as reference control signal provides a robust way to control the oscillators because a reference current is less susceptible to external influences than e.g. a reference voltage.

In an embodiment each frequency correction unit comprises a converter, in particular a digital-to-analogue converter, adapted to convert the difference into an analogue correction signal. Using analogue signals reduces the complexity of the distributed clock signal generator according to the present invention by allowing the use of simple analogue circuit components.

In an embodiment each frequency correction unit comprises an adder adapted to add the analogue correction signal to the reference control signal wherein each frequency correction unit is adapted to output the adjusted reference control signal to the associated secondary oscillator. Adding the analogue correction signal to the reference control signal provides a way of adjusting the secondary clock of the associated secondary oscillator easily with low complexity.

In an embodiment the primary oscillator is a component of a phase locked loop, PLL, of the integrated circuit IC. This allows taking advantage of components which are already provided e.g. in a circuit integrated in the IC.

In an embodiment the integrated circuit comprises a controlled current source adapted to generate the reference control signal according to a predetermined frequency of the primary clock signal, wherein the reference control signal comprises a control current which can be a direct current. Using a current as reference control signal provides a robust way to control the oscillators because a reference current is less susceptible to external influences than e.g. a reference voltage.

In an embodiment the predetermined frequency of the primary clock signal is between 1 MHz and 10 GHz, in particular between 1 GHz and 8 GHz, even more specific between 2 GHz and 5 GHz. This allows adapting the present invention to different use cases.

In an embodiment the primary oscillator and the secondary oscillators are current controlled oscillators. Using a current as reference control signal provides a robust way to control the oscillators because a reference current is less susceptible to external influences than e.g. a reference voltage.

In an embodiment the primary oscillator and the secondary oscillators have an identical electrical and/or geometrical structure. Such a primary oscillator and secondary oscillators would exhibit similar behaviour when receiving the same reference current. This allows an easy adjustment of the reference control signal which is provided to the secondary oscillators because only the on-die variation effects have to be compensated.

In an embodiment the primary logic unit and the at least one secondary logic unit are remotely located on the substrate of the integrated circuit. This allows providing a clock signal to different logic units on the substrate of the integrated circuit even if they are separate from each other without the need to duplicate e.g. a PLL.

In an embodiment each secondary oscillator is located near the associated secondary logic unit. This ensures that the secondary clock signal can be fed to the secondary logic unit with as little external disturbances as possible.

In an embodiment the distance between the primary logic and the at least one secondary logic is greater than 5 mm, and in particular greater than 10 mm.

In an embodiment a reference current source is adapted to generate the reference control signal based on a predetermined frequency of the primary clock signal.

FIG. 1 schematically shows an example of an embodiment of a distributed clock signal generator 1 according to the present invention.

The distributed clock signal generator 1 of FIG. 1 comprises a primary oscillator 3 which receives a reference control signal 5 and generates a primary clock signal 4.

The distributed clock signal generator 1 of FIG. 1 further comprises at least two frequency correction units 8-1 and 8-$n$, wherein n is the number of the provided frequency correction units 8-$i$, and i being an index. Each frequency correction unit 8-$i$ receives the reference control signal 5, and the primary control signal 4 to generate an adjusted reference control signal for respective secondary oscillators 6-1 and 6-$n$. The two frequency correction units 8-1 and 8-$n$ furthermore receive the secondary clock signal 7-1, 7-$n$ of the respective secondary oscillator 6-1 and 6-$n$ as shown in FIG. 1.

In FIG. 1 two secondary oscillators 6-1 and 6-$n$ are shown, wherein between the two secondary oscillators 6-1 and 6-$n$ an arbitrary number of further secondary oscillators 6-$i$ is insinuated by three dots. Consequently, the distributed clock signal generator 1 of FIG. 1 can comprise any number n of secondary oscillators 6-$i$. In an embodiment the distributed clock signal generator 1 also comprises only one secondary oscillator 6-1.

In FIG. 1 the reference control signal 5 is formed by a reference current $I_{ref}$. The reference current $I_{ref}$ is a direct current which is adapted such that the frequency of the primary clock signal 4 output can by the primary oscillator 3 equals a predetermined value for the clock frequency for the primary clock signal 4. The primary oscillator 3 and the secondary oscillators 6-1 and 6-$n$ are in a possible implementation current controlled oscillators 3, 6-1 and 6-$n$.

In another embodiment the primary oscillator 3 and the secondary oscillators 6-1 and 6-$n$ are voltage controlled oscillators 3, 6-1 and 6-$n$ and reference control signal 5 is a reference voltage $V_{ref}$. In yet another embodiment the primary oscillator 3 and the secondary oscillators 6-1 and 6-$n$ are digitally controlled oscillators 3, 6-1 and 6-$n$ and the reference control signal 5 is a digital reference control signal.

In an embodiment the distributed clock signal generator 1 is integrated in an integrated circuit 1 which is manufactured on a semiconductor substrate. In further embodiments the distributed clock signal generator 1 is formed by as a combination of integrated and discrete analogue and/or digital circuit components.

In an embodiment the frequency correction units 8-1 and 8-$n$ adjust the reference control current 5 in predetermined time intervals. In such an embodiment another clock source can be provided to generate a clock signal with a period length according to the measurement time limit. The measurement can also be derived from the primary reference clock signal 4 for instance by means of a counter which has a counting limit of, e.g. 10 clock cycles.

Figure 2:
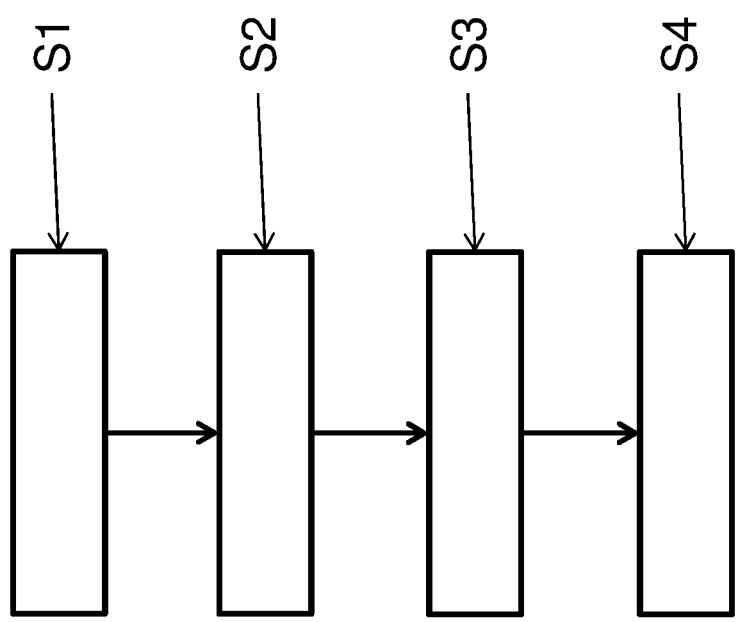
FIG. 2 schematically shows a block diagram of an example of an embodiment of a method according to the present invention.

FIG. 2 schematically shows a block diagram of an exemplary embodiment of a method according to the present invention. The method according to the present invention provides, as shown with first block, S1 a primary oscillator and at least one secondary oscillator. Furthermore, the method generates, as shown with second block, S2 with the primary oscillator 3 a primary clock signal 4 based on a reference control signal 5.

Furthermore, the method comprises, as shown with third block, S3 where by at least one secondary oscillator 6-1-6-$n$ a secondary clock signal 7-1-7-$n$ is generated based on the reference control signal 5, as shown with fourth block, S4 the method comprises adjusting the reference control signal 5 of the at least one secondary oscillator 6-1-6-$n$ is increased or decreased based on a difference of the primary clock signal 4 and the secondary clock signal 7-1-7-$n$ output by the respective secondary oscillator 6-1-6-$n$ such that the clock frequency of the respective secondary clock 7-1-7-$n$ signal essentially equals the clock frequency of the primary clock signal 4.

In an embodiment of the method according to the present invention adjusting the reference control signal 5 comprises integrating the primary clock signal 4 and integrating the respective secondary clock signal 7-1-7-$n$, as well as adjusting the reference control signal 5 for each secondary oscillator 6-1-6-$n$ based on the difference between the integrated primary clock signal 4 and the respective integrated secondary clock signal 7-1-7-$n$.

In an embodiment integrating the primary clock signal 4 and integrating the respective secondary clock signal 7-1-7-$n$ comprises counting the clock cycles of the primary clock signal 4 and counting the clock cycles of the respective secondary clock signal 7-1-7-$n$.

In an embodiment the primary clock signal 4 and the respective secondary clock signals 7-1-7-n are integrated over a predefined time interval and the adjusted reference control signal 5 is provided after every time interval. The time interval is longer than a period duration of the frequency of the primary clock signal, in particular 1 to 20 times the period duration of the frequency of the primary clock signal, or in particular 5 to 15 times the period duration of the frequency of the primary clock signal, or in particular 10 times the period duration of the frequency of the primary clock signal. In another embodiment other time spans are possible for the time interval.

In an embodiment adjusting the reference control signal 5 comprises calculating the difference between the integrated primary clock signal 4 and the integrated respective secondary clock signal 7-1-7-n. In an embodiment the difference is added to the reference control signal 4 and the adjusted reference control signal 4 is provided to the respective secondary oscillator 6-1-6-n. The difference can be converted into an analogue correction signal, e.g. a correction current, prior to adding the difference to the reference control signal 4.

Figure 3:
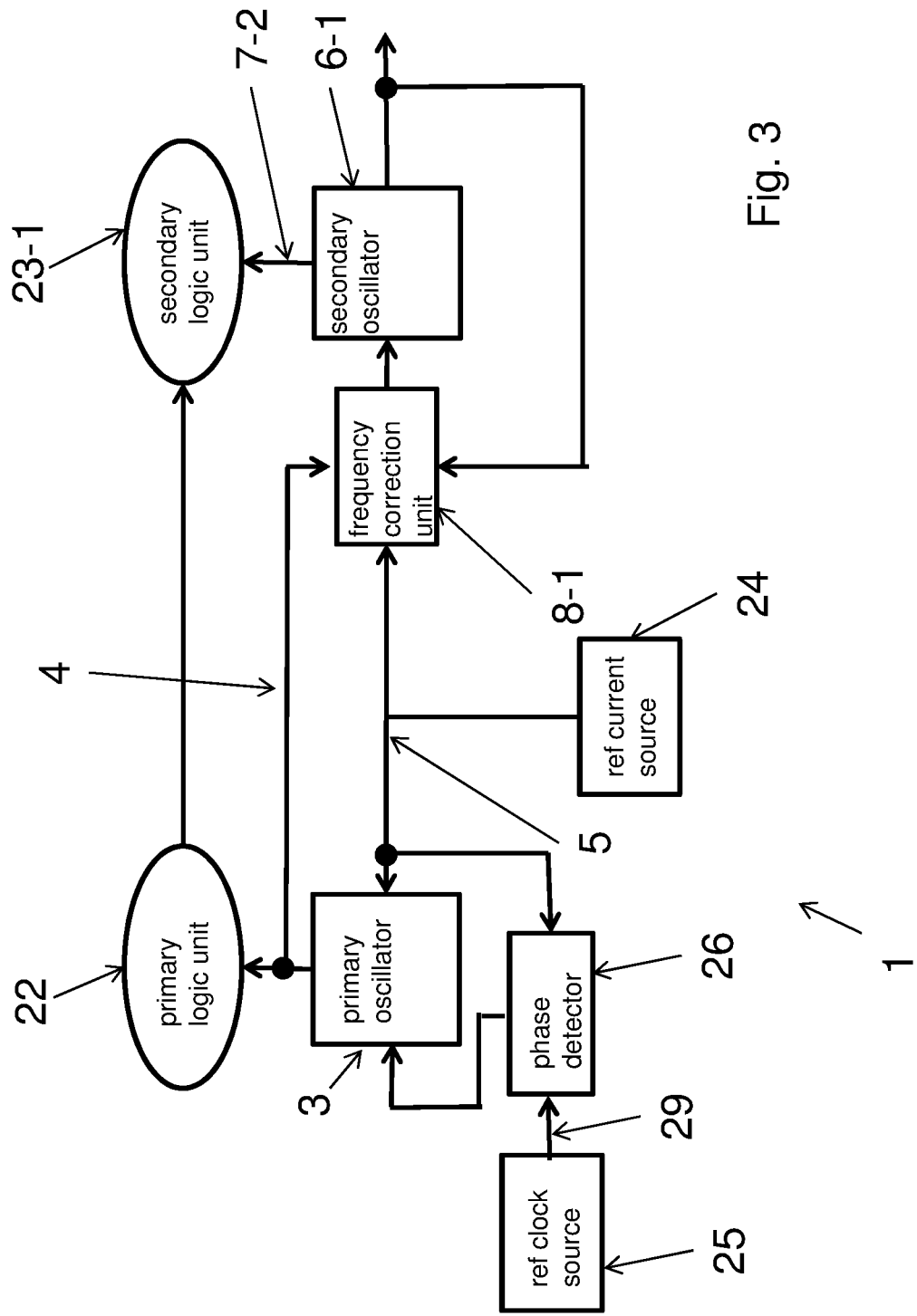
FIG. 3 schematically shows an example of a further embodiment of a distributed clock signal generator according to the present invention.

FIG. 3 schematically shows an example of an embodiment of a distributed clock signal generator 1 according to the present invention.

The distributed clock signal generator 1 in FIG. 3 comprises a primary oscillator 3 and a secondary oscillator 6-1. The primary oscillator 3 receives a control current 5 from a current source 24. The control current 5 is also fed into a frequency correction unit 8-1 and a corrected control current 5 is provided by the frequency correction unit 8-1 to a secondary oscillator 6-1.

Furthermore, a reference clock source 25 is provided, which provides a reference clock signal 29 to a phase detector 26. The phase detector 26 provides a phase detection signal to the primary oscillator 3 and receives the control current 5 from the current source 24. The phase detector 26 together with the primary oscillator 3 in FIG. 3 form part of a PLL of an integrated circuit, where PLLs details are not shown in FIG. 3 for sake of simplicity.

The primary oscillator 3 generates a primary clock signal 4 which is provided to a primary logic unit 22 and to the frequency correction unit 8-1.

Finally, the secondary oscillator 6-1 generates a secondary clock signal 7-2 which is supplied to a first secondary logic unit 23-1. The primary logic unit 22 and the secondary logic unit 23-1 are connected to each other by a communication link to exchange information.

Although the distributed clock signal generator 1 in FIG. 3 is displayed with only one secondary oscillator 6-1, any arbitrary number of secondary oscillators 6-1-6-n is possible.

In FIG. 3 the reference control signal 5 is described as a control current $I_{ref}$. In other embodiments the reference control signal 5 can be formed as reference voltage $V_{ref}$ or as digital reference control signal.

Figure 4:
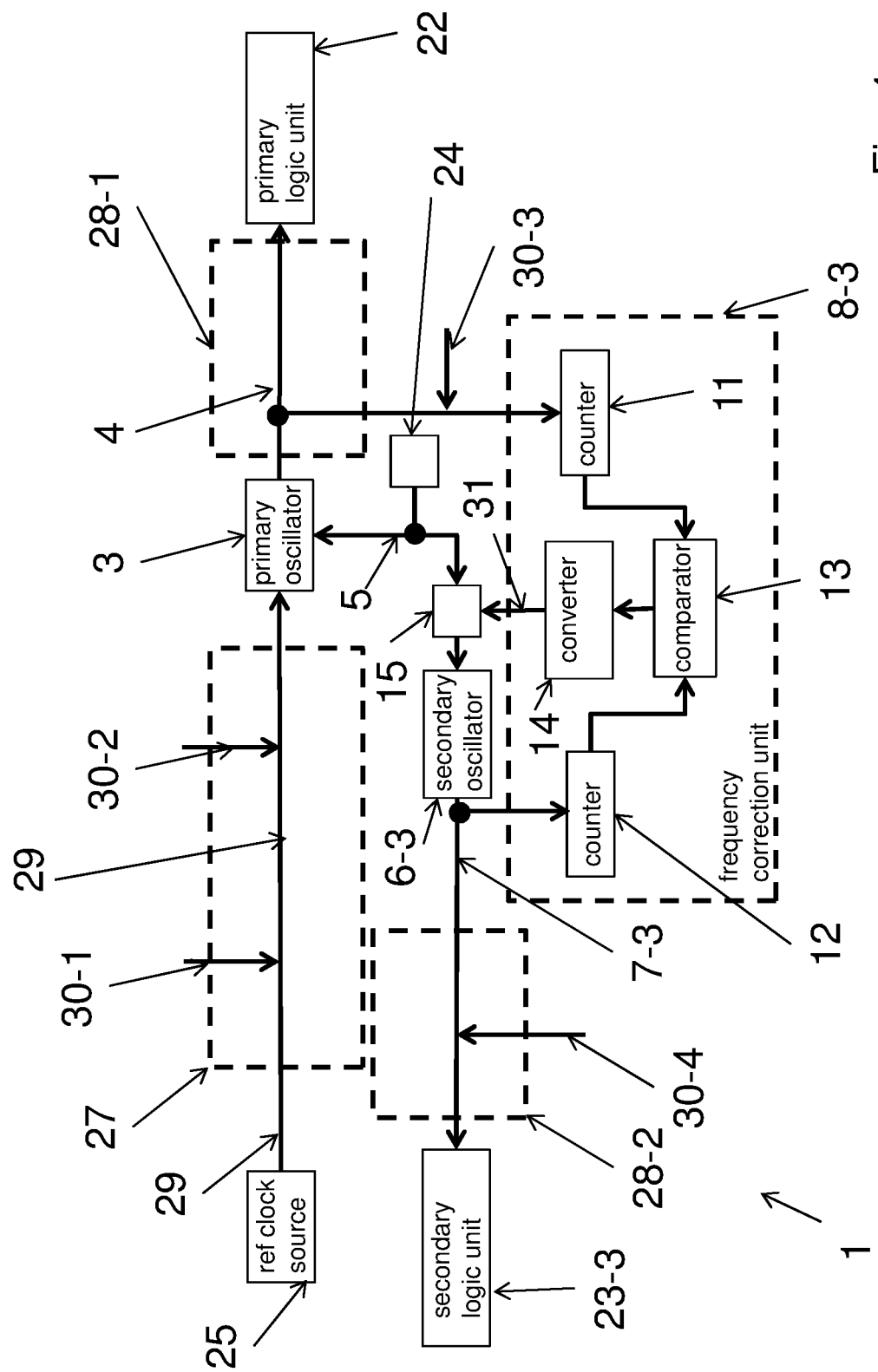
FIG. 4 schematically shows an example of a further embodiment of a distributed clock signal generator according to the present invention.

FIG. 4 schematically shows an exemplary embodiment of a distributed clock signal generator 1 according to the present invention.

In FIG. 4 a reference clock source 25 generates a reference clock signal 29. The reference clock signal 29 is a clock signal having a lower frequency than the primary clock signal 4 and is provided to the primary oscillator 3 via a reference clock track 27. In the reference clock track 27 different noise sources emit noise 30-1 and 30-2 which influences the reference clock signal 29 before it reaches the primary oscillator 3. The noise 30-1 and 30-2 can have a wide frequency spectrum and in an embodiment the reference clock track 27 is protected by adequate shielding measures from the noise 30-1 and 30-2.

The primary oscillator 3 receives a reference current 5 from a reference current source 24 and generates the primary clock signal 4 which is routed via a first fast clock track 28-1 to a primary logic unit 22 and to the frequency correction unit 8-3.

The reference current 5 is also supplied to an adder 15, which is adapted to add an adjustment current 31 to the reference current 5. The adjustment current 31 is generated by the frequency correction unit 8-3. The frequency correction unit 8-3 in FIG. 4 comprises a first counter 11, which receives the primary clock signal 4 via the fast clock track 28-1 from the primary oscillator 3. Furthermore, the frequency correction unit 8-3 in FIG. 4 comprises a second counter 12 which receives the secondary clock signal 7-3 from the secondary oscillator 6-3.

The counter values from the first counter 11 and the second counter 12 respectively are provided to a comparator 13, which compares the counter values and forwards the calculated difference between the counter values of the first counter 11 and the second counter 12 to a converter 14 which converts the received difference into the adjustment current 31, which is then added to the reference current 5 by adder 15.

In an embodiment the comparator 13 is configured to output a counter value which can be positive and negative. Consequently, the converter 14 is embodied to generate a positive adjustment current 31 as well as a negative adjustment current 31 depending on the output of the comparator 13.

The secondary clock signal 7-3 is also provided via a fast clock track 28-2 to a secondary logic 23-3. Noise 30-4 influences the secondary clock signal 7-3 in the fast clock track 28-3. But, because secondary oscillator 6-3 can be placed near the secondary logic 23-3 the distance between the secondary oscillator 6-3 and the secondary logic 23-3 is short and can easily be shielded or protected against noise 30-4.

In FIG. 4 the frequency correction unit 8-3 comprises digital components like the first counter 11, the second counter 12 and the comparator 13. In another embodiment the digital components can be exchanged for analogue components like, e.g. analogue integrators 11 and 12 and an analogue comparator 13. In such an embodiment the analogue comparator 13 can output an analogue voltage and the converter 14 can be a formed by voltage controlled current source 14.

Figure 5:
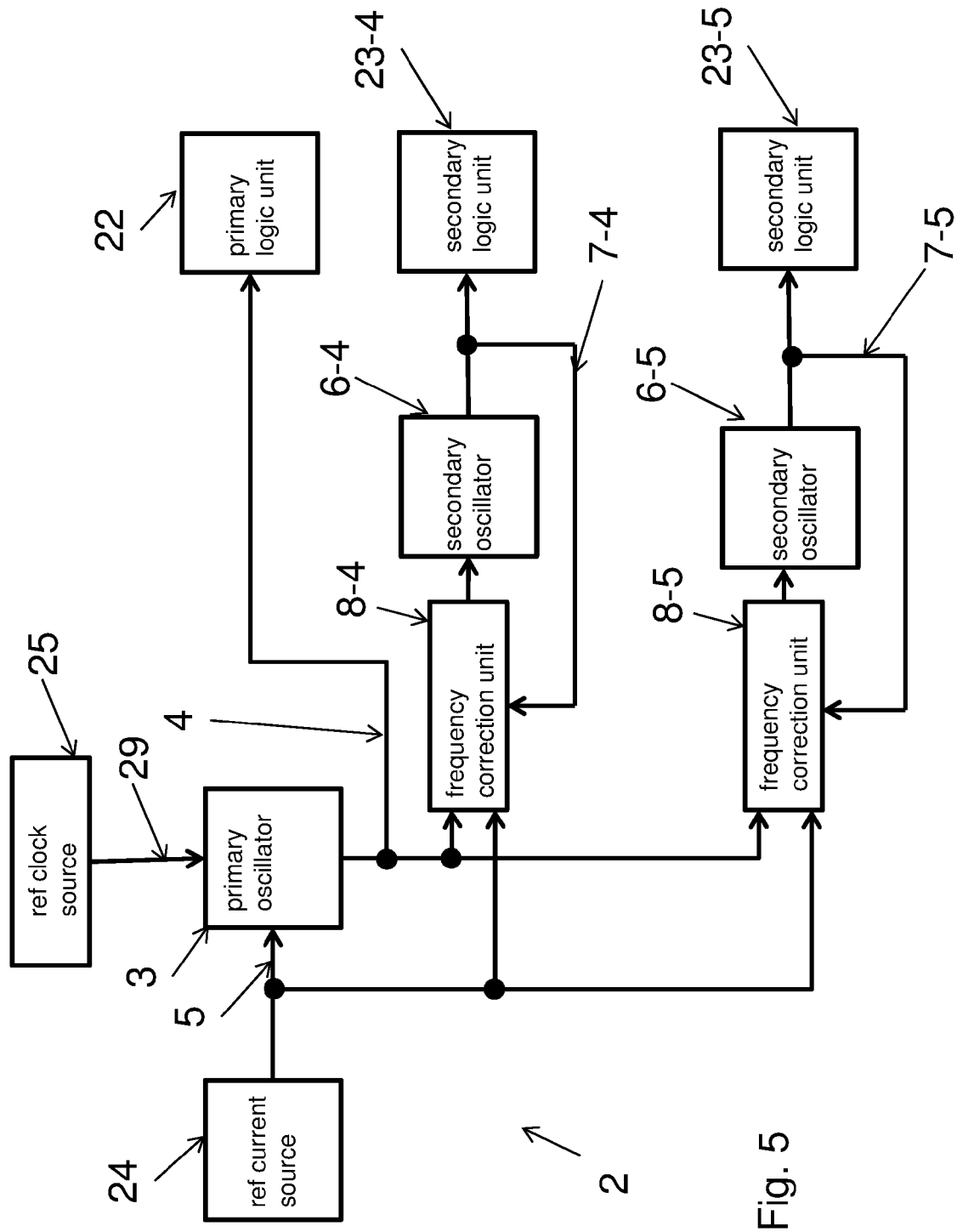
FIG. 5 schematically shows an example of a further embodiment of an integrated circuit according to the present invention.
Figure 6:
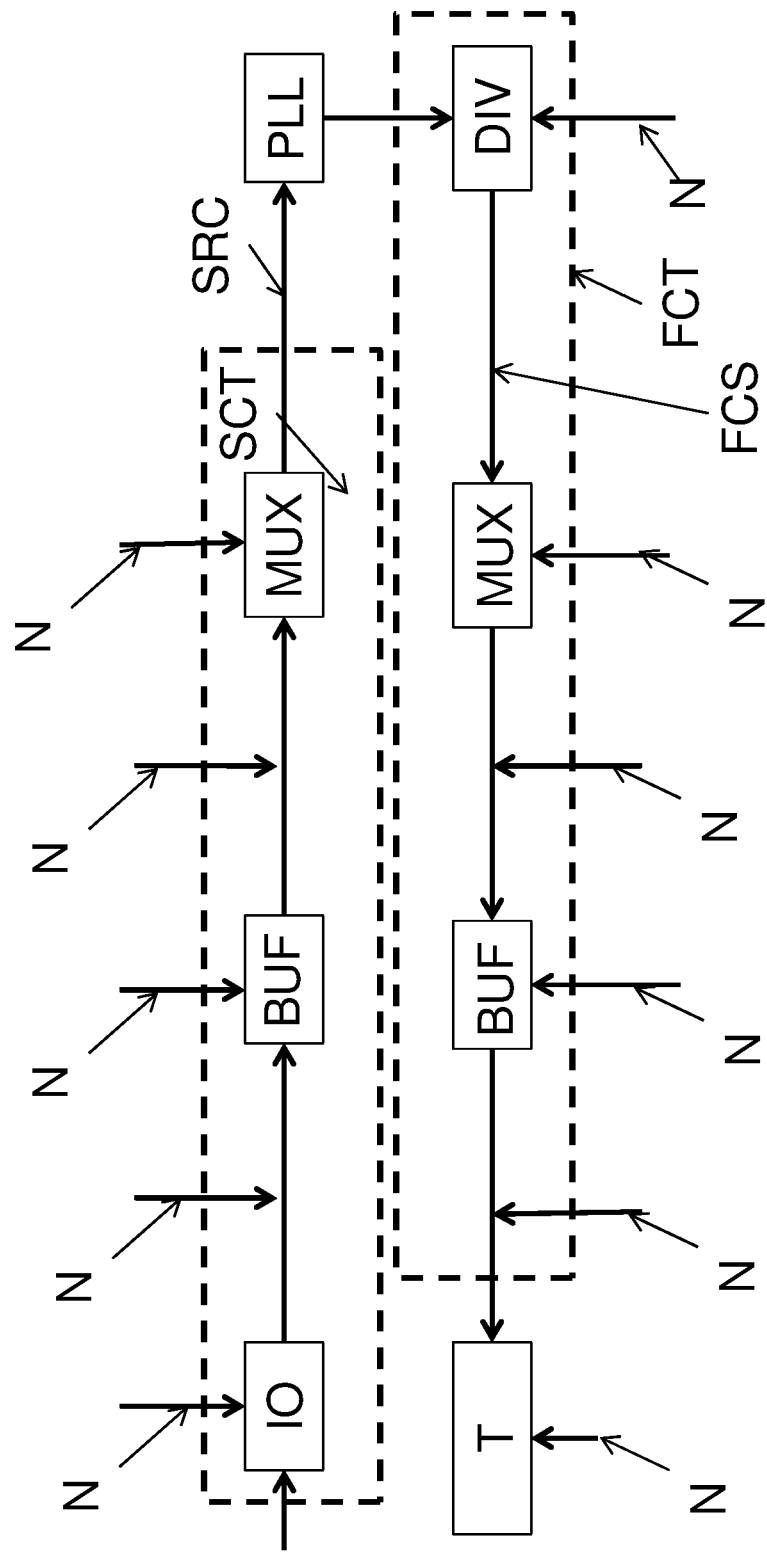
FIG. 6 schematically shows a block diagram of a clock distribution track of an integrated circuit.

FIG. 5 schematically shows an exemplary of an embodiment of an integrated circuit 2 according to the present invention.

The integrated circuit 2 in FIG. 5 comprises a reference clock source 25 which provides a reference clock signal 29 to a primary oscillator 3. Furthermore the integrated circuit 2 comprises a reference current source 24 which provides a reference current 5 to the primary oscillator 3 and to frequency correction units 8-4 and 8-5.

The primary oscillator 3 generates a primary clock signal 4 which is provided to a primary logic unit 22 as well as to the frequency correction units 8-4 and 8-5.

The frequency correction unit 8-4 generates a corrected reference current 5 for a secondary oscillator 6-4 based on the primary clock signal 4, the reference current 5 and the secondary clock 7-4 which is generated by the secondary oscillator 6-4. Similarly, the frequency correction unit 8-5 generates a corrected reference current 5 for a secondary oscillator 6-5 based on the primary clock signal 4, the reference current 5 and the secondary clock 7-5 which is generated by the secondary oscillator 6-5.

Finally, the secondary clock signal 7-4 is provided to a secondary logic unit 23-4 and the secondary clock signal 7-5 is provided to a secondary logic unit 23-5.

The integrated circuit 2 in FIG. 5 can be a microcontroller which comprises a primary logic unit 22 which is a first processing core 22 and a secondary processing logic unit 23-4 which is a second processing core 23-4. Furthermore, the secondary logic unit 23-5 of the microcontroller comprises peripheral components, like e.g. I/O-drivers, memory blocks, internal bus drivers or the like.

In other embodiments the integrated circuit 2 can be another type of integrated circuit 2, like for example a configurable logic component, like an FPGA or a CPLD, a digital signal processor DSP or an application specific integrated circuit ASIC, e.g. in digital signal processing or communications environments, or the like.

In FIG. 5 interconnections between the single logic units 22, 23-4 and 23-5 are not specifically shown for ease of understanding. But, in other embodiments a plurality of different interconnections between the logic units 23-i can be provided. In an embodiment one of the logic units, e.g. logic unit 23-5, comprises an internal data bus and corresponding bus drivers and interconnects the primary logic unit 22 with the secondary logic unit 23-4.

In another embodiment the present invention is not limited to only one integrated circuit 2. The primary clock signal 4 and/or the secondary clock signal 7-4 and 7-5 can for example be routed to components which are mounted on a Printed Circled Board PCB. In an embodiment the primary clock signal 4 and the reference current 5 are routed on a PCB to components external to the integrated circuit 2 which each comprise a frequency correction unit and a secondary oscillator.

An operating system (OS) is the software that manages the sharing of the resources of a computer and provides programmers with an interface used to access those resources. An operating system processes system data and user input, and responds by allocating and managing tasks and internal system resources as a service to users and programs of the system.

The method according to the present invention may also be implemented in a computer program for running on a computer system, at least including code portions for performing a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the scope of the invention as set forth in the appended claims, which accordingly are not limited to the specific examples. For instance, while the present invention is described using examples in the field of high frequency integrated circuits, the present invention is not limited to this kind of integrated circuits, but may be also employed for other kinds of integrated circuits or applications. Also, for example, the connections may be an type of connection suitable to transfer signals from or to the respective nodes, units or devices, for example via intermediate devices. Accordingly, unless implied or stated otherwise the connections may for example be direct connections or indirect connections.

The semiconductor substrate of the integrated circuit herein can be any semiconductor material or combinations of materials, such as gallium arsenide, silicon germanium, silicon-on-insulator (SOI), silicon, monocrystalline silicon, the like, and combinations of the above.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 5 and the discussion thereof describe an exemplary integrated circuit architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of integrated circuit 2 are circuitry located on a single integrated circuit or within a same device. Alternatively, integrated circuit 2 may include any number of separate integrated circuits or separate devices interconnected with each other. For example, memory may be located on integrated circuit 2 or on a separate integrated circuit or located within another peripheral or slave discretely separate from other elements of integrated circuit 2. Peripheral 18 and I/O circuitry 16 may also be located on separate integrated circuits or devices. Also for example, integrated circuit 2 or portions thereof may be soft or code representations of physical circuitry or of logical representations convertible into physical circuitry. As such, integrated circuit 2 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of integrated circuit 2, for example, from computer readable media such as memory or other media on other computer systems. Such computer readable media may be permanently, removably or remotely coupled to an information processing system such as integrated circuit 2. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In an embodiment, integrated circuit 2 can form part of a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device. For example, However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A distributed clock signal generator in or for an integrated circuit, the distributed clock signal generator comprising:
   a primary oscillator configured to generate a primary clock signal based on a reference control signal;
   at least one secondary oscillator wherein each secondary oscillator is configured to generate a secondary clock signal based on the reference control signal;
   wherein for each secondary oscillator a frequency correction unit is provided and configured such to adjust the reference control signal for the associated secondary oscillator based on the primary clock signal and the secondary clock signal of the associated secondary oscillator such that the clock frequency of the secondary clock signal of the associated secondary oscillator essentially equals the clock frequency of the primary clock signal; and
   wherein each frequency correction unit comprises an integrator which is adapted to integrate the primary clock signal and to integrate the secondary clock signal of the associated secondary oscillator and wherein each frequency correction unit is adapted to adjust the reference control signal for the associated secondary oscillator based on the difference between the integrated primary clock signal and the integrated respective secondary clock signal.

2. The distributed clock signal generator according to claim 1,
   wherein the integrator comprises a first counter adapted to count the clock cycles of the primary clock signal and a second counter adapted to count the clock cycles of the secondary clock signal of the associated secondary oscillator.

3. The distributed clock signal generator according to claim 1,
   wherein each frequency correction unit is adapted to integrate the primary clock signal and the secondary clock signal of the associated secondary oscillator over a predefined time interval and to provide the adjusted reference control signal after every time interval.

4. The distributed clock signal generator according to claim 3
   wherein the time interval lasts longer than a period duration of the frequency of the primary clock signal.

5. The distributed clock signal generator according to claim 1,
   wherein each frequency correction unit comprises a comparator adapted to calculate the difference between the integrated primary clock signal and the integrated secondary clock signal of the associated secondary oscillator.

6. The distributed clock signal generator according to claim 5,
   wherein each frequency correction unit comprises a converter adapted to convert the difference into an analogue correction signal.

7. The distributed clock signal generator according to claim 6,
   wherein each frequency correction unit comprises an adder adapted to add the analogue correction signal to the reference control signal and wherein each frequency correction unit is adapted to output the adjusted reference control signal to the associated secondary oscillator.

8. The distributed clock signal generator according to claim 1, wherein the primary oscillator is a component of a phase locked loop of the integrated circuit.

9. The distributed clock signal generator according to claim 1,
   wherein the integrated circuit comprises a controlled current source adapted to generate the reference control signal according to a predetermined frequency of the primary clock signal; and
   wherein the reference control signal comprises a control current.

10. The distributed clock signal generator according to claim 9,
    wherein the predetermined frequency of the primary clock signal is in a frequency range between 1 MHz and 10 GHz.

11. The distributed clock signal generator according to claim 1,
    wherein the primary oscillator and the secondary oscillators are current controlled oscillators; and/or
    wherein the primary oscillator and the secondary oscillators have an identical electrical and/or geometrical structure.

12. An integrated circuit, comprising:
    at least one distributed clock signal generator for providing a primary clock signal and at least one secondary clock signal, the distributed clock signal generator comprising:
    a primary oscillator configured to generate a primary clock signal based on a reference control signal;
    at least one secondary oscillator wherein each secondary oscillator is configured to generate a secondary clock signal based on the reference control signal;
    wherein for each secondary oscillator, a frequency correction unit is provided wherein each frequency correction unit comprises an integrator which is adapted to integrate the primary clock signal and to integrate the secondary clock signal of the associated secondary oscillator and wherein each frequency correction unit is adapted to adjust the reference control signal for the associated secondary oscillator based on the difference between the integrated primary clock signal and the integrated respective secondary clock signal and such that the clock frequency of the secondary clock signal of the associated secondary oscillator essentially equals the clock frequency of the primary clock signal;
    at least one primary logic unit which is supplied with the primary clock signal;
    at least one secondary logic unit which is supplied with the secondary clock signals.

13. The integrated circuit of claim 12,
    wherein the primary logic unit and the at least one secondary logic unit are remotely located on the substrate of the integrated circuit; and/or
    wherein each secondary oscillator is located near the associated secondary logic unit.

14. The integrated circuit claim 12,
    wherein the primary logic unit and the at least one secondary logic unit are distanced to each other, wherein a distance between the primary logic unit and the at least one secondary logic unit is greater than 5 mm.

15. The integrated circuit of claim 12, comprising a reference current source adapted to generate the reference control signal based on a predetermined frequency of the primary clock signal.

16. A method for distributing a clock signal for integrated circuits, comprising:
- providing a primary oscillator and at least one secondary oscillator;
- generating by the primary oscillator a primary clock signal based on a reference control signal;
- generating by the at least one secondary oscillator a secondary clock signal based on the reference control signal;
- increasing or decreasing the reference control signal of the at least one secondary oscillator based on a difference of the primary clock signal and the secondary clock signal of the respective secondary oscillator such that the clock frequency of the respective secondary clock signal essentially equals the clock frequency of the primary clock signal;
- integrating the primary clock signal;
- integrating the secondary clock signal of the secondary oscillator, and
- adjusting the reference control signal for the associated secondary oscillator based on the difference between the integrated primary clock signal and the integrated respective secondary clock signal.

17. The integrated circuit of claim 12, wherein the integrator comprises a first counter adapted to count the clock cycles of the primary clock signal and a second counter adapted to count the clock cycles of the secondary clock signal of the associated secondary oscillator.

* * * * *